United States Patent [19]

Hatada et al.

[11] Patent Number: 5,365,402
[45] Date of Patent: Nov. 15, 1994

[54] COOLING APPARATUS OF ELECTRONIC DEVICE

[75] Inventors: Toshio Hatada; Shigeo Ohashi, both of Tsuchiura; Tadakatsu Nakajima; Heikichi Kuwahara, both of Ibaraki; Hitoshi Matsushima, Ryugasaki; Motohiro Sato; Hiroshi Inouye, both of Ibaraki; Takao Ohba; Akira Yamagiwa, both of Hadano; Kanji Otsuka, Higashiyamato; Yuuji Shirai, Kodaira, all of Japan

[73] Assignee: Hitachi, Ltd., Tokyo, Japan

[21] Appl. No.: 800,268

[22] Filed: Nov. 29, 1991

[30] Foreign Application Priority Data

Nov. 30, 1990 [JP] Japan .................................. 2-329248

[51] Int. Cl.⁵ .................................................. H05K 7/20
[52] U.S. Cl. ...................................... 361/699; 361/689; 361/704; 361/765; 174/16.3; 165/80.4
[58] Field of Search ............... 361/380, 382, 385, 386, 361/388, 389, 401, 402, 679, 689, 699, 704, 707, 714, 761, 765; 174/15.2, 16.3; 165/185, 80.3, 80.4; 357/71, 80, 81, 82; 257/723, 714

[56] References Cited

U.S. PATENT DOCUMENTS

| 4,688,150 | 8/1987 | Peterson | 361/403 |
| 4,750,086 | 6/1988 | Mittal | 361/382 |
| 4,879,632 | 11/1989 | Yamamoto et al. | 361/386 |
| 4,949,219 | 8/1990 | Moriizumi et al. | 361/386 |
| 4,993,482 | 2/1991 | Dolbear et al. | 165/80.2 |
| 4,996,589 | 2/1991 | Kajiwara et al. | 357/82 |
| 5,000,256 | 3/1991 | Tousignant | 165/46 |
| 5,006,924 | 4/1991 | Frankeny et al. | 357/82 |
| 5,045,921 | 9/1991 | Lin et al. | 357/74 |
| 5,055,914 | 10/1991 | Shimizu et al. | 357/81 |

Primary Examiner—Leo P. Picard
Assistant Examiner—Young Whang
Attorney, Agent, or Firm—Antonelli, Terry, Stout & Kraus

[57] ABSTRACT

A cooling apparatus for an electronic device of high calorific density including an elastomer interposed between a semiconductor chip and a heat sink so as to connect them thermally. The elastomer may also be in close contact with a large number of semiconductor chips having various configurations which are mounted on a board, so that the elastomer is thermally connected with them, whereby the elastomer absorbs thermal deformations.

15 Claims, 5 Drawing Sheets

COOLING APPARATUS OF ELECTRONIC DEVICE

BACKGROUND OF THE INVENTION

The present invention relates to cooling apparatus for an electronic device including a semiconductor chip is incorporated and, more particularly, to cooling apparatus for enabling cooling in accordance with an amount of heat generation and which is suitable for preventing deformations or some other unfavorable phenomena of the semiconductor chip.

Arrangements wherein a radiator fin or a thermal diffusion plate such as a thermal conductive layer is directly attached to a casing of LSI chips mounted on a board in order to increase an amount of heat radiation are disclosed in, for example, "Electronics", August 1989, p. 29, and Japanese Patent Unexamined Publication No. 63-289847.

In these conventional arrangements, an electronic device is integral with a heat sink of a specific configuration. Consequently, when the electronic device is operated in such a manner that the amount of heat generation in chips incorporated in the device is larger than the amount of heat absorption by the heat sink, it is necessary to attach, to the electronic device, a heat sink of a different configuration to accomodate the circumstances. However, a connection method which is excellent in heat conduction and highly reliable must be employed every time such replacement is conducted, and such cooling arts are not flexible enough for cooling of the entire system.

Another arrangement is disclosed in Japanese Patent Unexamined Publication No. 61-74356, wherein a cooling jacket is fixed onto a plurality of semiconductor chips by bolts, with an elastic member of fibrous cotton having high thermal conductivity being interposed therebetween so as to cool the semiconductor chips.

In last-mentioned conventional arrangement, the elastomer is designed to be a thin layer to improve the thermal conductivity. Consequently, unless the jacket is attached to the semiconductor chips with high accuracy, an undue force is exerted on the chips. As a result, the semiconductor chips can not be cooled in accordance with the respective amounts of heat generated by the respective chips, and this arrangement is not flexible enough for cooling of the entire device system.

A further arrangement is disclosed in Japanese Patent Unexamined Publication No. 1-286455, wherein a ribbed thermal conductive member is provided on a semiconductor chip mounted on an insulating board, and a heat sink, including a radiator fin, is attached to the ribbed thermal conductive member with presssure springs and rotary ball members interposed therebetween, which heat sink can be detached and is guided and moved in directions parallel to the insulating board by a guide mechanism of the ribbed thermal conductive member.

In this last-mentioned conventional arrangement, although the heat sink is detachable, the pressure springs tend to cause the force to affect the insulating board and the ribbed thermal conductive member, resulting in a force that will break the semiconductor chip. Additionally, high assembly accuracy is required for improving the thermal conductivity.

SUMMARY OF THE INVENTION

It is an object of the present invention to provide cooling apparatus for an electronic device which includes a structure which can absorb a thermal deformation difference between the heat sink and a thermal diffusion plate and an external pressure, and which has high thermal conductivity, when one of various types of heat sinks, such as an air-cooling heat sink and a water-cooling heat sink, is mounted to the device corresponding to an amount of heat generation in LSI chips.

Another object of the invention is to provide cooling apparatus of an electronic device which is flexible enough for cooling the entire system, whereby a cooling jacket, dependent upon the amount of heat generation in the respective semiconductor chips, is detachable.

A further object of the invention is to provide cooling apparatus of an electronic device which can cool semiconductor chips having different volumes and heights.

The above objects can be achieved by providing cooling apparatus of the electronic device with an elastomer layer or elastic member made of an elastic and thermal conductive material such as, for example, rubber or coil springs, between two layers of a thermal diffusion plate and a joint plate for cooling the semiconductor chips.

Another characteristic in the cooling apparatus of the invention is that detachable fixing means are provided for fixing the heat sink on the joint plate which is thermally connected to the semiconductor chips through the elastomer layer or elastic member layer interposed therebetween.

Another characteristic of the cooling apparatus of the invention is that a water pillow-like elastomer or a composite elastomer is interposed between a plurality of semiconductor chips and the joint plate.

A further characteristic of the cooling apparatus of the invention is that two such composite elastomers are provided on both sides of a heat pipe.

Other characteristics, objects and advantages of the invention will be more obvious in the following description with reference to the attached drawings.

DESCRIPTION OF THE PREFERRED EMBODIMENTS

Figure 1:
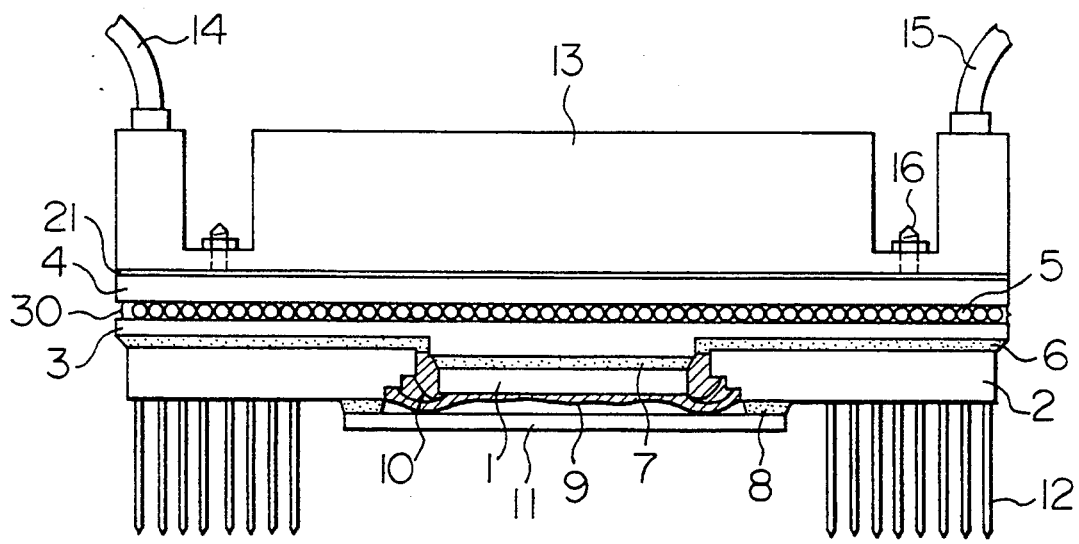
FIG. 1 is a vertical cross-sectional view of cooling apparatus according to the present invention.
Figure 2:
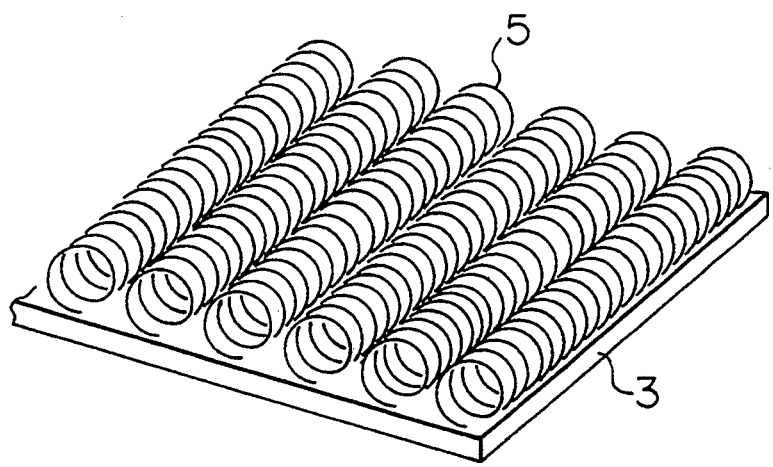
FIG. 2 is an enlarged perspective view of a part of FIG. 1, showing an elastomer shaped like coil springs.

Referring to the first embodiment of FIGS. 1 and 2, a wiring board 2 has a plurality of semiconductor chips 1 mounted thereon, with each semiconductor chip 1 being provided in a recess of the wiring board 2. This semiconductor chip 1 has a logical function, a memory function and so forth, and constitutes a main part of a semiconductor device.

A plurality of lead pins 12 are provided on the bottom side of the wiring board 2 with the lead pins 12 connecting the semiconductor chip 1 with outside equipment through connecting holes in the wiring board 2 via wiring 10.

A thermal diffusion plate 3 is secured to the other side of the wiring board 2 remote from the pins 12, by an elastomer 6. This thermal diffusion plate 3, the semiconductor chip 1 and the wiring 10 are bonded to each other with an elastomer 7 and a coating gel 9.

In this embodiment, the elastomer 7 is preferably made of rubber or the like so that the semiconductor chip 1 can be prevented from being affected by an excessively large force due to generation of heat in the semiconductor chip 1. In order to effectively transmit the heat generated in the semiconductor chip 1 to a heat sink 13 condition, it is an essential condition that the contact thermal resistance between the semiconductor chip 1 and the elastomer 7, and the thermal resistance of the elastomer 7 are both small. Therefore, the distance between the semiconductor chip 1 and the thermal diffusion plate 3 is reduced to reduce the thermal resistances. On the side of the wiring board 2 where the lead pins 12 are located, a cap 11 is attached through an elastomer 8, so as to cover the semiconductor chip 1. A joint plate 4 is provided on the top of the thermal diffusion plate 3, with an elastomer 5 shaped like coil springs being interposed therebetween. It is joined with the thermal diffusion plate 3 on the outer periphery by means of an elastic support member 30. A jacket 13, which is used for cooling, is fastened to the joint plate 4 through grease 21 by means of bolts 16. This jacket 13 includes a cavity (not shown) therein so that cooling fluid circulates in it. A cooling fluid inlet 14 is provided in one side portion of the jacket 13, and a cooling fluid outlet 15 is provided in another portion. The cooling fluid is introduced into the cavity through this cooling fluid inlet 14, and discharged out of the semiconductor device through the cooling fluid outlet 15. The jacket 13 is usually made of a light-weight material, for example, aluminum.

The elastomer layer such as, for example, the elastomer 5 shaped as coil springs which, is interposed between the thermal diffusion plate 3 and the joint plate 4, with the elastomer 5 being made of a metal or the like having a high thermal conductivity. In this case, the metal is worked into a wire material, and it is coiled to have a small diameter. The elastomer 5, fashioned as coil springs juxtaposed in many rows (FIG. 2), is closely contacted with the joint plate 4 and the thermal diffusion plate 3.

In the embodiment shown in FIG. 1, the joint plate 4 and the jacket 13 are fixed by the bolts 16. However, the joint plate 4 and the jacket 13 may integrally be formed in one piece.

When, for example, a computer including the semiconductor chips 1, begins operating, heat is generated in each semiconductor chip 1 and is conducted to the thermal diffusion plate 3 through the elastomer 7 and the coating gel 9. From the thermal diffusion plate 3, the heat is then transmitted through the elastomer 5, shaped like coil springs, to the joint plate 4, the grease 21 and the jacket 13. The heat transmitted to the jacket 13 is absorbed by the cooling fluid supplied from the cooling fluid inlet 14. On the other hand, the cooling fluid, which has absorbed the heat and has increased in temperature, is discharged out of the jacket 13 through the cooling fluid outlet 15. Consequently, the heat is conducted through metallic coil sections, thus suppressing the thermal resistance between the thermal diffusion plate 3 and the joint plate 4 to an extremely small value.

In this embodiment, the elastomer 5, shaped like coil springs, is interposed between the thermal diffusion plate 3 and the joint plate 4, and the joint plate 4 is joined with the thermal diffusion plate 3 by the elastic support member 30, so that the following function and effect can be provided.

Since the integrally structured package itself, which is connected to the outside heat sink such as the jacket 13, is provided with the elastomer 5 shaped like coil springs which can allow displacements, no extra force is exerted on the semiconductor chip 1 when the heat sink is mounted to it. Consequently, the heat sink and the joint plate can be connected to each other without any special connecting means but simply by fastening with the bolts. Therefore, the assembly is easy when the heat sink 13 is mounted to the device. In addition, as described above, the elastomer 5, shaped like coil springs not only has the displacement absorbing function but also produces an effect of reducing the thermal resistance due to its large contact area.

Besides, in this embodiment and also in the case where the joint plate 4 and the jacket 13 are formed integrally, even if a thermal displacement is caused by a temperature difference between the jacket 13 and the thermal diffusion plate 3, the elastomer 5, shaped like coil springs, can absorb the displacement, thereby improving the reliability of the semiconductor chip 1.

Figure 3:
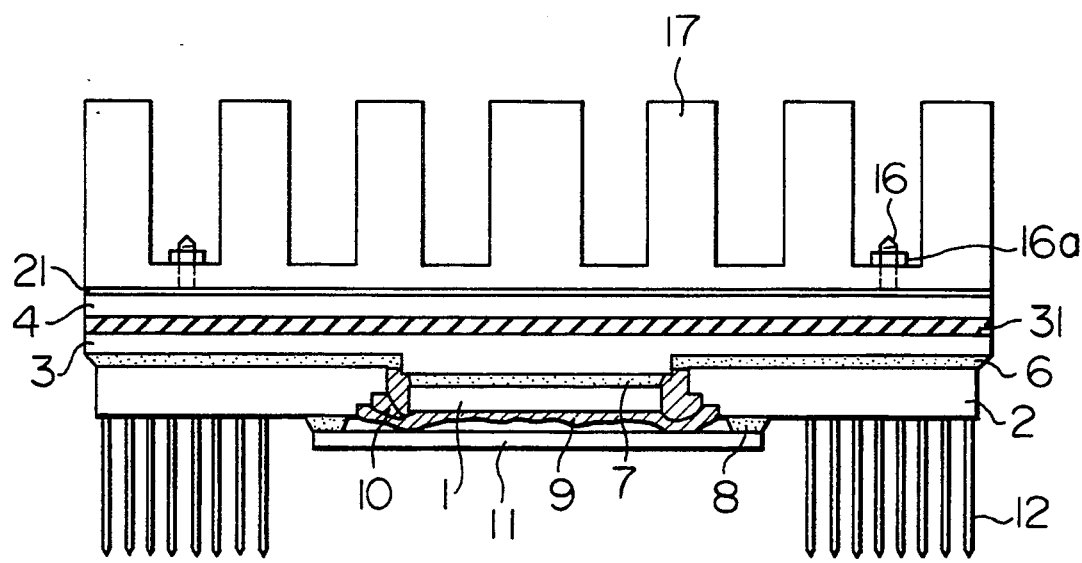
FIG. 3 is a vertical cross-sectional view of cooling apparatus, showing a partially modified embodiment according to the invention.
Figure 4:
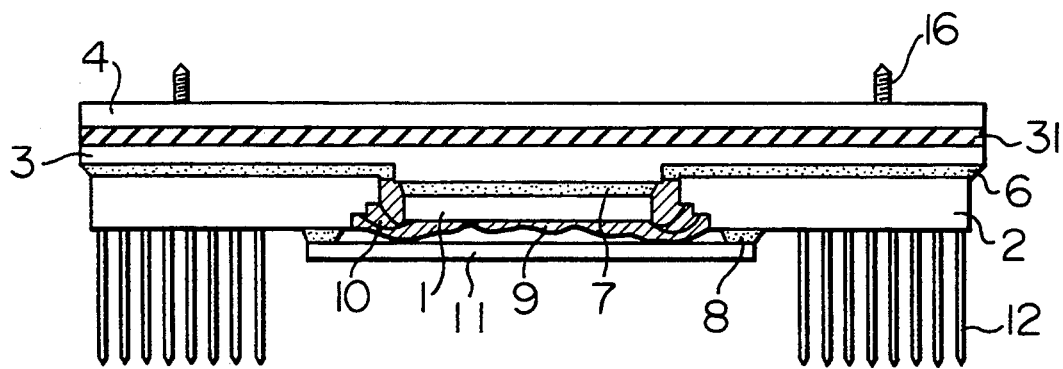
FIG. 4 is a vertical cross-sectional view showing the cooling apparatus of FIG. 3 without a fin.

The embodiments of FIGS. 3–7 have substantially the same structures of the wiring board 2, the thermal diffusion plate 3 and so forth as the embodiment shown in FIGS. 1 and 2. As shown in FIG. 3, however, an air cooling fin 17 is employed as a heat sink, and a rubber-like member 31 is used as an elastomer between the joint plate 4 and the thermal diffusion plate 3. In the case of using the air cooling fin 17, its end portions are not restricted, and, consequently, an elastomer to absorb a thermal deformation of the heat sink alone may be used. Referring to FIG. 4 which shows the package without the fin 17, the joint plate 4 and the fin 17 may be joined with eash other by fitting the fin 17 to the bolts 16 which are provided on the joint plate 4 through the grease 21 interposed therebetween, and tightening nuts 16a on it. Alternatively, the joint plate 4 and the fin 17 may be formed integrally.

In this modified embodiment, the elastomer is incorporated in the package, i.e., between the joint plate 4 and the thermal diffusion plate 3, so that the heat sink can be mounted by fastening with the bolts. There is another effect that the interposition of the rubber-like elastomer 31 prevents the thermal deformation and the force exerted on the heat sink from unduly affecting the semiconductor chip 1.

Figure 6:
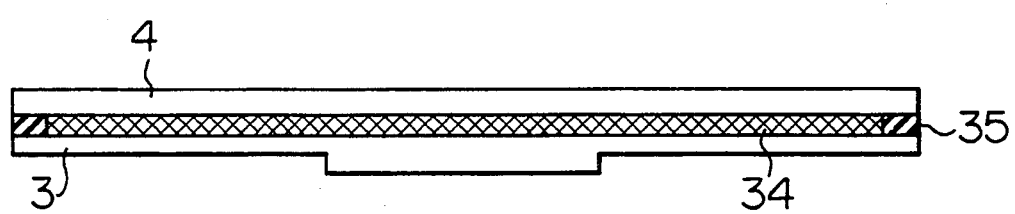
FIG. 6 is a vertical cross-sectional view showing another modification of an elastomer.
Figure 7:
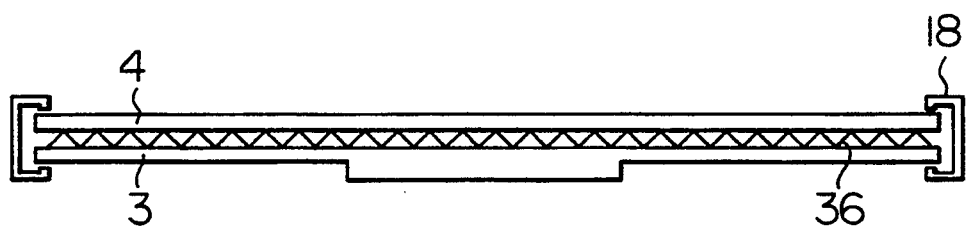
FIG. 7 is a vertical cross-sectional view showing a further modification of an elastomer.

In the modified embodiment shown in FIGS. 3 and 4, the rubber-like elastomer 31 is interposed between the joint plate 4 and the thermal diffusion plate 3. Instead of such a rubber-like elastomer, however, a water pillow-like elastomer 33, a metal mesh-like elastomer 34 and a leaf spring-like elastomer 36 may be used, as shown in FIGS. 5, 6 and 7, respectively.

Figure 5:
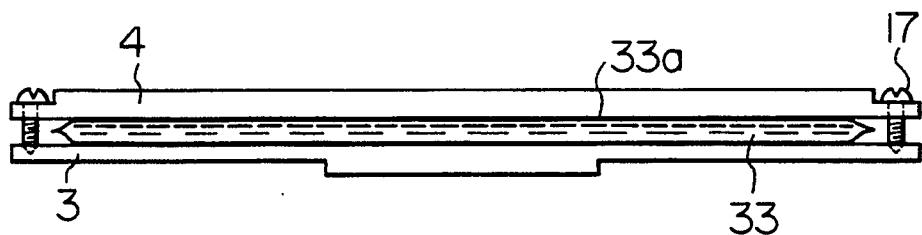
FIG. 5 is a vertical cross-sectional view showing a modification of an elastomer.

FIG. 5 illustrates a modification having a structure to which the water pillow-like elastomer 33 is applied. The water pillow-like elastomer 33 comprises an integument 33a which contains liquid. This integument 33a is, preferably, made of a material such as rubber, plastic, metal or the like. The liquid content is preferably water, perfluorocarbon (carbon fluoride), liquid metal or the like, which has a high thermal conductivity and a low corrosiveness. This water pillow-like elastomer 33 is interposed between the joint plate 4 and the thermal diffusion plate 3, the outer peripheral ends of which are fastened by bolts 17. When the water pillow-like elastomer 33 is employed, the integument 33a can be freely deformed, thereby improving the close fitness between the joint plate 4 and the thermal diffusion plate 3. Also, it can absorb their deformations. FIG. 6 illustrates a further modification having the metal mesh-like elastomer 34 which is provided with a metal mesh-like member therein and with a rubber-like member on the outer peripheral ends as an elastomer. The metal mesh-like member serves as a deforming member having a high thermal conductivity, and the rubber-like member serves to make the elastomer restore to a predetermined size. The structure of the elastomer shown in FIG. 6 is characterized in that it is highly reliable (durable). FIG. 7 illustrates another modification applying the leaf spring-like elastomer 36. The leaf spring-like elastomer 36 is a plate having sufficient elasticity which is shaped as a corrugated plate. The elastomer is interposed between the joint plate 4 and the thermal diffusion plate 3, and the outer peripheral ends of the joint plate 4 and the thermal diffusion plate 3 are fixed by clamp means 18. This illustrated modification is characterized in that the structure is simple.

Figure 8:
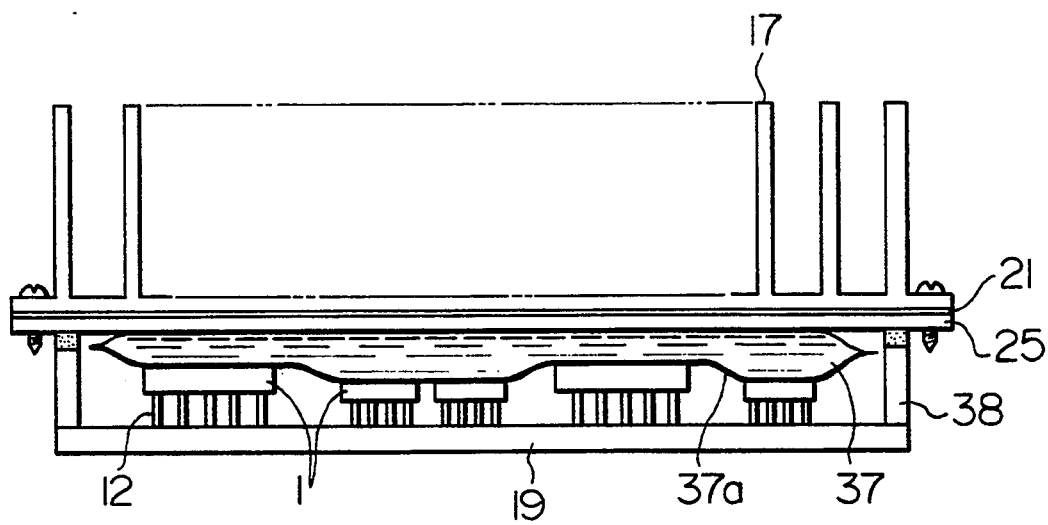
FIG. 8 is a vertical cross-sectional view of cooling apparatus, showing a different embodiment of the invention.
Figure 9:
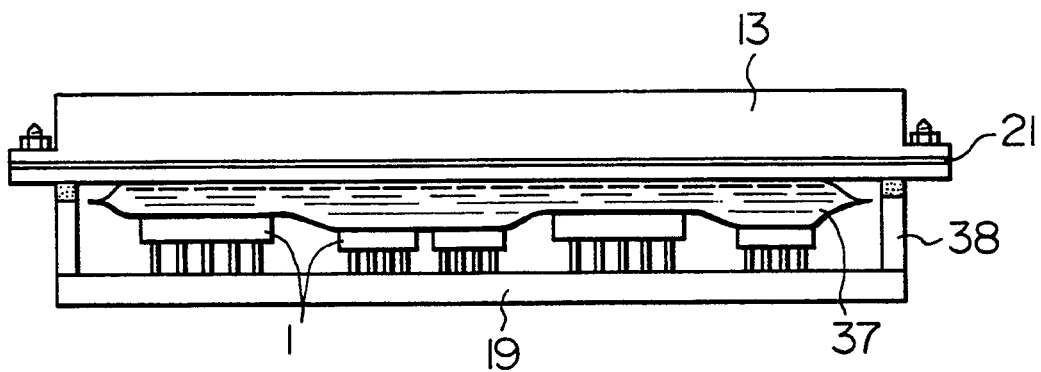
FIG. 9 is a vertical cross-sectional view of cooling apparatus, showing a still other embodiment of the invention.

FIGS. 8 and 9 show further embodiments of the present invention which are applied to a multi-chip package. More specifically, a pillow-like elastomer 37 is provided in contact with a plurality of semiconductor chips 1 having different volumes and heights, and they are packaged integrally. As shown in FIGS. 8 and 9, this package comprises the plurality of semiconductor chips 1 having different volumes and heights which are mounted on a board 19 with pins 12 interposed therebetween, and the pillow-like elastomer 37 which is provided between the semiconductor chips 1 and a joint plate 25 secured to the top of a frame 38 which is formed on the outer periphery of the board 19. In the embodiment shown in FIG. 8, the air cooling fin 17 is mounted to the package with the grease 21 interposed therebetween. In the embodiment shown in FIG. 9, the jacket 13 is mounted to the package with the grease 21 interposed therebetween.

With the above-described structure, the water pillow-like elastomer 37 is deformed to absorb displacements even if the semiconductor chips 1 have different volumes and heights, so that there can be provided cooling apparatus having high thermal conductivity.

Figure 10:
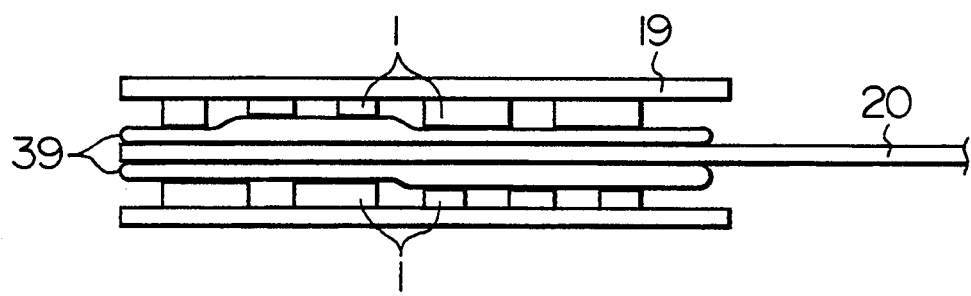
FIG. 10 is a vertical cross-sectional view of cooling apparatus, showing a further embodiment of the invention.
Figure 11:
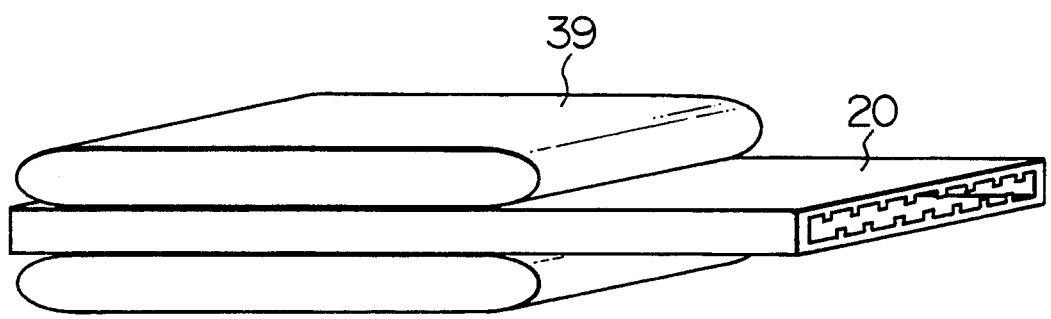
FIG. 11 is an enlarged perspective view of a portion of FIG. 10, showing an elastomer.

FIGS. 10 and 11 show another embodiment in which a composite elastomer 39 and a heat pipe 20 are combined as a heat sink. In this case, the composite elastomer 39 is a thermal conductive member having a flexible structure.

This embodiment is, as shown in FIG. 10, of the sandwich-type structure wherein the heat sink is held between two boards 19 on each of which semiconductor chips having different volumes and heights are mounted. Referring to FIG. 11, this heat sink is designed so that composite elastomers 39 such as water pillow-like elastomers or metal mesh-like elastomers are disposed on both sides of the heat pipe 20. Although in this embodiment the composite elastomers 39 are provided on both sides, a composite elastomer may be provided on one appropriate side of the heat pipe. In the present embodiment, thermal deformations and the like can be absorbed, and also, cooling can be performed uniformly by interposing the heat sink between the boards on each of which heating elements having various dimensions are mounted.

What is claimed is:

1. Cooling apparatus of an electronic device comprising a semiconductor chip mounted on a wiring board, and a heat sink for radiating heat of said semiconductor chip, wherein said cooling apparatus further comprises a thermal diffusion plate, an elastomer interposed between said thermal diffusion plate and said semiconductor chip, a joint plate mounted on said thermal diffusion plate, and a thermal conductive member of flexibility interposed between said joint plate and said thermal diffusion plate, said thermal diffusion plate and said joint plate being united with said semiconductor chip, and wherein said heat sink is mounted on said joint plate.

2. Cooling apparatus of an electronic device according to claim 1, wherein said thermal conductive member is a spring.

3. Cooling apparatus of an electronic device according to claim 1, wherein said thermal conductive member is a rubber-like member.

4. Cooling apparatus of an electronic device according to claim 1, wherein said thermal conductive member is one of a water pillow-like member and a metal mesh-like member.

5. Cooling apparatus of an electronic device comprising a semiconductor chip mounted on a wiring board, and a heat sink for radiating heat of said semiconductor chip, wherein said cooling apparatus further comprises a thermal diffusion plate provided on said semiconductor chip, said thermal diffusion plate and said semiconductor chip having an elastomer interposed therebetween, a thermal conductive member of flexibility mounted on said thermal diffusion plate, and a joint plate mounted to said heat sink, said joint plate and said thermal diffusion plate being thermally connected through said thermal conductive member of flexibility.

6. Cooling apparatus of an electronic device according to claim 5, wherein said joint plate and said thermal diffusion plate are joined with each other by an elastic support member so as to enable a packaging of said joint plate, said thermal diffusion plate and said thermal conductive member.

7. Cooling apparatus of an electronic device comprising a semiconductor chip mounted on a wiring board, and a heat sink for radiating heat of said semiconductor chip, wherein said heat sink is mounted to said a joint plate, said cooling apparatus further comprising a thermal diffusion plate provided on a lower side of said joint plate, with a first elastic member having thermal conductivity interposed therebetween; and a second elastic member arranged so as to cover an entire top surface of said semiconductor chip and having thermal conductivity to transmit heat from said semiconductor chip to said thermal diffusion plate, and wherein said thermal diffusion plate diffuses heat transmitted from said second elastic member, both of which are interposed between said semiconductor chip and said first elastomer as viewed in a direction of a side of the semiconductor chip.

8. Cooling apparatus of an electronic device according to claim 7, wherein said first elastic member having thermal conductivity is a spring.

9. Cooling apparatus of an electronic device according to claim 7, wherein said first elastic member having thermal conductivity is fashioned of a rubber material.

10. Cooling apparatus of an electronic device according to claim 7, wherein said first elastic member having thermal conductivity is one of a water pillow and a metal mesh.

11. Cooling apparatus of an electronic device according to claim 7, wherein said semiconductor chip is provided in plural on said board, the surfaces of said plurality of semiconductor chips remote from the surfaces on the side of said board being contacted with said first elastic member.

12. Cooling apparatus of an electronic device according to claim 11, wherein said first elastic member having thermal conductivity is like one of a water pillow and a metal mesh.

13. Cooling apparatus of an electronic device according to claim 11, wherein the size of said first elastic member having thermal conductivity is substantially the same as that of said board.

14. Cooling apparatus of an electronic device according to claim 7, wherein two boards are disposed in such a manner that the surfaces with semiconductor chips face inwardly, said heat sink having a portion located between said two boards, said plurality of semiconductor chips and said heat sink being contacted through said first elastic member having thermal conductivity.

15. Cooling apparatus of an electronic device according to claim 14, wherein said first elastic member having thermal conductivity is a composite elastomer.

* * * * *